(12) United States Patent
Kitade et al.

(10) Patent No.: US 8,963,539 B2
(45) Date of Patent: Feb. 24, 2015

(54) ELECTRONIC CIRCUIT, INTEGRATED CIRCUIT, AND MAGNETIC FIELD DETECTION DEVICE AND ELECTRONIC DEVICE INCLUDING THE SAME

(75) Inventors: Tetsuya Kitade, Kyoto (JP); Shinji Yano, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 366 days.

(21) Appl. No.: 13/404,291

(22) Filed: Feb. 24, 2012

(65) Prior Publication Data

US 2012/0217959 A1  Aug. 30, 2012

(30) Foreign Application Priority Data

Feb. 24, 2011  (JP) ................. 2011-038411

(51) Int. Cl.
 *G01B 7/14* (2006.01)
 *G01R 33/00* (2006.01)
 *G01R 33/07* (2006.01)

(52) U.S. Cl.
 CPC .......... *G01R 33/0029* (2013.01); *G01R 33/072* (2013.01)
 USPC ...................................... 324/207.2

(58) Field of Classification Search
 USPC ............... 324/207.2, 207.11, 207.12, 207.13, 324/207.14, 207.21, 207.22, 207.23, 324/207.24, 207.25, 207.26, 160–180, 251, 324/252; 702/145–148, 151
 See application file for complete search history.

(56) References Cited

U.S. PATENT DOCUMENTS

| | | | | |
|---|---|---|---|---|
| 4,353,016 A * | 10/1982 | Born | ......................... | 318/400.23 |
| 5,406,202 A * | 4/1995 | Mehrgardt et al. | ........... | 324/251 |
| 5,929,631 A * | 7/1999 | Striker et al. | ............ | 324/207.21 |
| 6,307,365 B1 * | 10/2001 | Santos et al. | ............. | 324/207.12 |
| 6,328,136 B1 * | 12/2001 | Tauchi et al. | ................ | 187/391 |
| 6,431,011 B1 * | 8/2002 | Feller | ......................... | 73/861.12 |
| 6,803,760 B2 * | 10/2004 | Jones et al. | ............. | 324/207.25 |
| 7,263,781 B2 * | 9/2007 | Sielemann | ...................... | 33/708 |
| 7,441,464 B2 * | 10/2008 | Turnbull et al. | ................ | 73/779 |
| 2004/0263155 A1 * | 12/2004 | Schroeder et al. | ....... | 324/207.12 |
| 2005/0127899 A1 * | 6/2005 | Kakuta et al. | ............. | 324/207.2 |
| 2006/0043963 A1 * | 3/2006 | Kaneyasu et al. | ........... | 324/179 |
| 2008/0231266 A1 * | 9/2008 | Hayashi et al. | .......... | 324/207.25 |
| 2010/0019704 A1 * | 1/2010 | Ueda | .......................... | 318/400.3 |
| 2010/0026279 A1 * | 2/2010 | Vig et al. | ...................... | 324/173 |
| 2010/0072988 A1 * | 3/2010 | Hammerschmidt et al. | ........................ | 324/207.25 |
| 2010/0163333 A1 * | 7/2010 | Patil et al. | ..................... | 180/402 |
| 2011/0043197 A1 * | 2/2011 | Trontelj | ................... | 324/207.25 |

FOREIGN PATENT DOCUMENTS

| | | |
|---|---|---|
| JP | 2007-180215 | 7/2007 |
| JP | 2008-032431 | 2/2008 |

* cited by examiner

*Primary Examiner* — Patrick Assouad
*Assistant Examiner* — Demetrius Pretlow
(74) *Attorney, Agent, or Firm* — Fish & Richardson P.C.

(57) ABSTRACT

An electronic circuit for detecting magnetism includes: a detection unit in which at least three detection blocks including at least one magnetic field detection element are arranged, wherein by selecting first and second detection blocks from among the at least three detection blocks based on a detection target object, a distance between the first and second detection blocks becomes a distance suitable for the detected target object; a control unit configured to select the first and second detection blocks; and a switching unit configured to connect the selected first and second detection blocks to an output of the electronic circuit based on a control operation of the control unit.

3 Claims, 10 Drawing Sheets

ELECTRONIC CIRCUIT, INTEGRATED CIRCUIT, AND MAGNETIC FIELD DETECTION DEVICE AND ELECTRONIC DEVICE INCLUDING THE SAME

CROSS-REFERENCE TO RELATED APPLICATION

This application is based upon and claims the benefit of priority from Japanese Patent Application No. 2011-38411, filed on Feb. 24, 2011, the entire contents of which are incorporated herein by reference.

TECHNICAL FIELD

The present disclosure relates to an electronic circuit, an integrated circuit, and a magnetic field detection device and an electronic device including the same, and more specifically, to a configuration of an electronic circuit for detecting magnetism, which includes three or more magnetic field detection elements and is capable of selecting a distance between magnetic field detection elements suitable for a detection target object.

BACKGROUND

Generally, for example, a hall element that outputs a voltage proportional to a magnetic intensity has been known as a magnetic sensor for detecting magnetism.

As a target object whose magnetism is detected by a magnetic field detection device including the magnetic sensor, for example, a bar magnet where N magnetic poles and S magnetic poles are alternately arranged in a length direction, a circular or ring-shaped magnet where N magnetic poles and S magnetic poles are alternately arranged in a circumference direction, or a coil is used. Furthermore, by detecting the change of a magnetic force between the adjacent N magnetic and S magnetic poles of a magnet, an operational direction and speed of a device including the magnet are detected. At least two magnetic sensors are used in the magnetic field detection device.

In the related art, a hall element is disposed at each intersection point of row wirings and column wirings, and a plurality of integrated hall sensors arranged in an array has been proposed. In this configuration, by controlling the turn-on/off of a transistor disposed between adjacent hall elements, a desired hall element is selected from the array to operate as a hall sensor.

SUMMARY

For example, as illustrated in FIG. 1, a case that detects the magnetism of a ring-shaped magnet 10 where N magnetic poles and S magnetic poles are alternately arranged in a circumference direction and thus detects the rotation of a device (for example, a motor) including the magnet 10 is exemplified.

In this case, in FIG. 1, a magnetic field detection unit 20 including two hall elements may be used. Furthermore, a processing unit 30 amplifies a detected magnetic signal and performs offset cancel processing on the detected magnet signal. Herein, although the radius of the magnet 10 or an interval (or angle) between adjacent magnet poles is changed according to the size of a device such as a motor to be detected, an interval L1 between hall elements in a magnetic field detection unit 20 is predetermined, and thus a detection precision may be degraded depending on the specification of the magnet 10. Also, when a detection precision is preferentially considered, the shape of the magnet 10 detected may be restricted.

Moreover, by using the magnetic field detection unit 20 that has an element interval corresponding to the specification of the magnet 10, a detection precision can be enhanced, but a magnetic field detection unit corresponding to a detection target object is required. Therefore, the modification of the magnetic field detection unit is required, and the manufacturing cost rises.

Alternatively, as illustrated in another comparison example of FIG. 2, by using two magnetic field detection units 25 and 26 having one hall element, an interval between the magnetic field detection units 25 and 26 may be set as an interval L2 suitable for the magnet 10. In this case, however, since the two magnetic field detection units 25 and 26 are used, the number of components in a circuit increases, and thus, it is difficult to efficiently secure and use the space of the circuit. Also, a deviation occurs in the installation precision of the two magnetic field detection units 25 and 26, and thus affects a detection precision or increases a mounting process for the circuit. Due to these reasons, the increase in the manufacturing cost may occur or be caused.

The present disclosure provides some embodiments of an electronic circuit for detecting magnetism, which can maintain or enhance the detection precision of magnetism, without accompanying restriction in shape of a magnet to be detected and the increase in the manufacturing cost thereof.

According to one embodiment of the present disclosure, provided is an electronic circuit for detecting magnetism of a detection target object, including: a detection unit in which at least three detection blocks including at least one magnetic field detection element are arranged; a control unit configured to select first and second detection blocks from among the at least three detection blocks based on the detection target object; and a switching unit configured to connect the selected first and second detection blocks to an output of the electronic circuit based on a control operation of the control unit.

In one embodiment, the second detection block is selected such that a first distance between the first and second detection blocks corresponds to the detection target object.

In one embodiment, the at least three detection blocks may be arranged in a straight line.

In one embodiment, a second distance to the first detection block and a third distance to the second detection block from a central position of the at least three detection blocks arranged in a straight line are approximately equal.

In one embodiment, the first detection block may be a predetermined detection block in the at least three detection blocks. The second detection block may be selected such that a distance from the first detection block to the second detection block corresponds to the detection target object.

In one embodiment, each of the detection blocks may include one magnetic field detection element.

In one embodiment, each of the detection blocks may include a plurality of magnetic field detection elements.

In one embodiment, each of the detection elements is a hall element. A source voltage may be applied to each of the detection elements such that a current having a phase deviating from each other flows in each of the detection elements.

In one embodiment, the detection block may include four magnetic field detection elements adjacent to each other. A source voltage is applied to each of the four magnetic field detection elements such that a phase difference between a current flowing in one magnetic field detection element and a current flowing in the other magnetic field detection element becomes 90 degrees, 180 degrees, or 270 degrees.

In one embodiment, the electronic circuit may further include first and second processing units respectively connected to the first and second detection blocks through the switching unit disposed therebetween, and each of the first and second processing units is configured to decrease an offset component included in a signal from a magnetic field detection element which is included in each of the first and second detection blocks.

In one embodiment, each of the first and second processing units may include: an amplification circuit configured to amplify an output of a corresponding detection block; a sample hold circuit configured to receive and hold the amplified output; and a filter circuit configured to filter an output of the sample hold circuit.

In one embodiment, the at least three detection blocks may be arranged in a zigzag pattern.

In one embodiment, the detection target object may be a circular magnet in which a first magnetic pole and a second magnetic pole having an opposite polarity from each other to the first magnetic pole are alternately arranged to be adjacent to each other in a circumference direction. The first and second detection blocks may be selected such that a first angle formed by the first and second detection blocks with respect to a center of the circular magnet becomes one-fourth or three-fourth of a second angle formed by the first and second magnetic poles adjacent to each other with respect to the center of the circular magnet.

According to yet another embodiment of the present disclosure, provided is an integrated circuit which includes the electronic circuit integrated therein.

According to still another embodiment of the present disclosure, provided is a magnetic field detection device which includes the electronic circuit mounted thereon.

According to still another embodiment of the present disclosure, provided is an electronic device which includes the electronic circuit mounted thereon.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
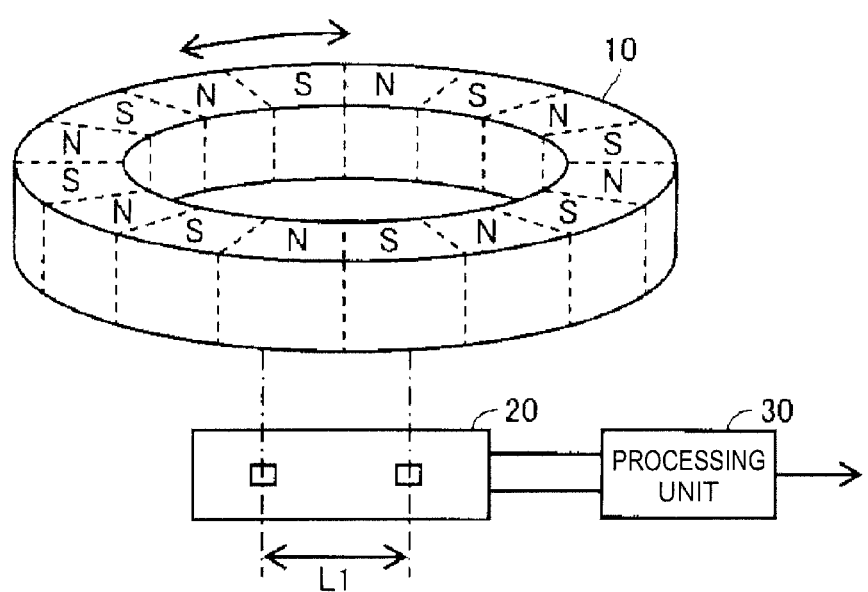
FIG. 1 is a diagram for describing a problem in a magnetic field detection device of a comparison example.
Figure 2:
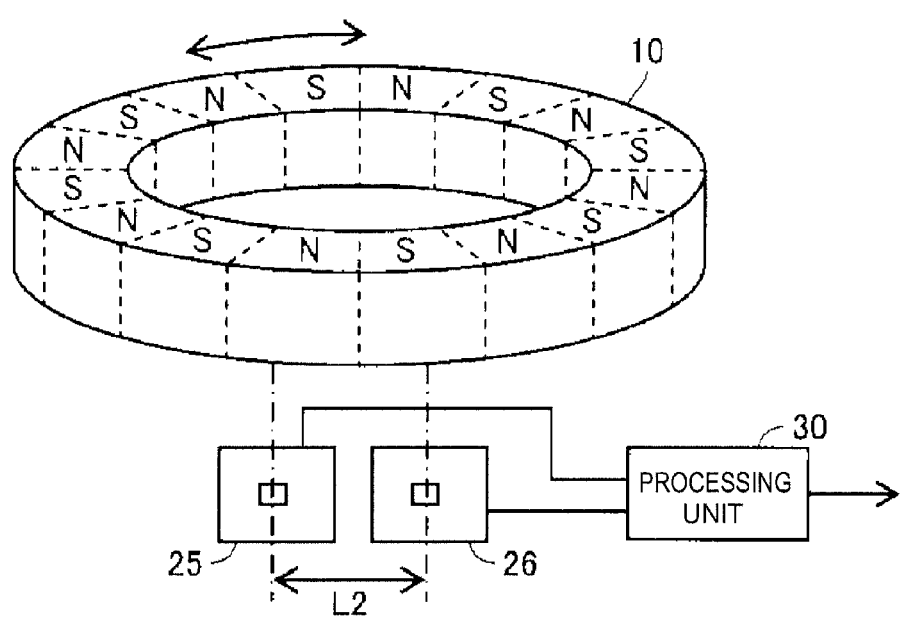
FIG. 2 is a diagram for describing a problem in a magnetic field detection device of another comparison example.

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments. Also, the same or equal elements in the drawings are indicated by the same reference numerals, and their descriptions are not provided.

Figure 3:
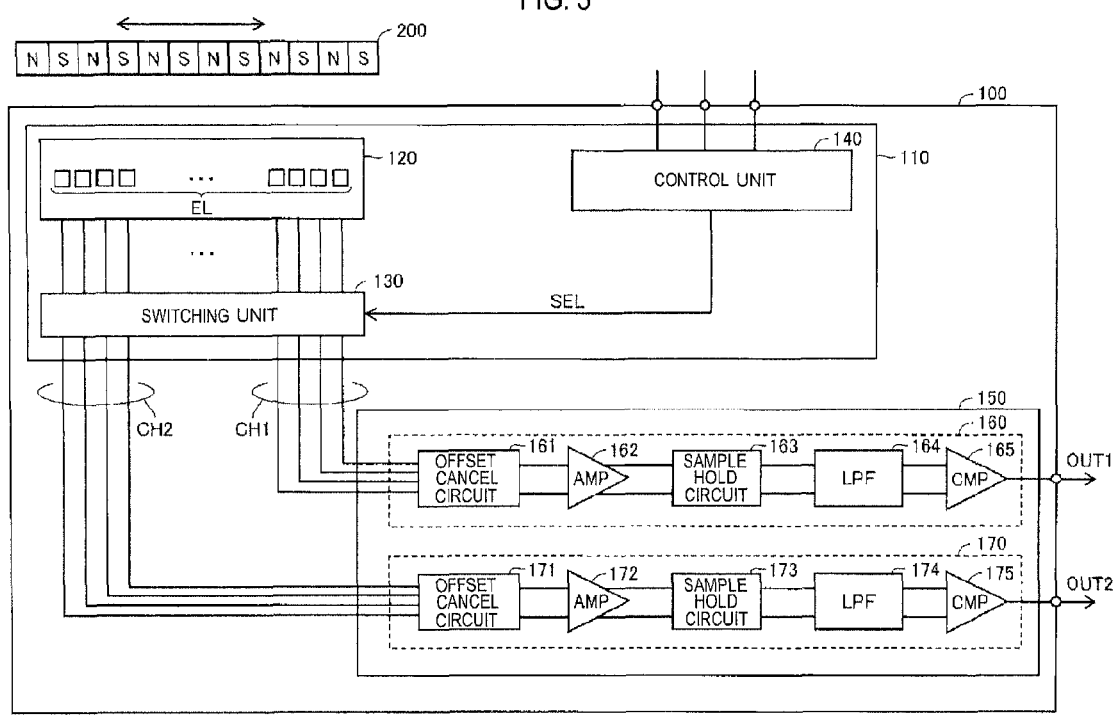
FIG. 3 is an entire block diagram of a magnetic field detection device according to an embodiment of the present disclosure.

FIG. 3 is a block diagram of a magnetic field detection device 100 according to an embodiment of the present disclosure. Referring to FIG. 3, the magnetic field detection device 100 includes a magnetic field detection circuit 110, and a processing circuit 150.

The magnetic field detection device 100 is generally included in an electronic device that performs a linear operation or a rotational operation, and used to detect an operation of the electronic device. Such an electronic device may include, for example, a power window, a slide door, a motor, a rotation gear, a wheel key, a track ball or the like.

The magnetic field detection circuit 110 includes a magnetic field detection unit 120, a switching unit 130, and a control unit 140.

The magnetic field detection unit 120, for example, has a structure where at least three magnetic field detection elements EL, such as hall elements, are disposed in a row.

The control unit 140 selects magnetic field detection elements EL, which are used for detection, from the magnetic field detection unit 120 on the basis of an external command. The selection of a magnetic field detection elements EL is determined on the basis of a size of a magnet 200 to be detected or an interval between adjacent magnetic poles in the magnet 200.

The switching unit 130 is connected to the magnetic field detection unit 120 and the processing circuit 150.

The switching unit 130 allows the magnetic field detection elements EL selected by the control unit 140 to be connected to the processing circuit 150, based on a control signal SEL from the control unit 140.

The processing circuit 150 includes a plurality of processing units 160 and 170 that respectively processes signals from respective magnetic field detection elements EL of channels CH1 and CH2 selected by the switching unit 130.

The processing unit 160 includes an offset cancel circuit 161, an amplification circuit 162, a sample hold circuit 163, a filter circuit 164, and a comparison circuit 165.

The offset cancel circuit 161 receives a signal from a magnetic field detection element EL that is selected as the channel CH1 by the switching unit 130.

When the magnetic field detection element EL is a hall element, a signal detected by the hall element includes an effective signal component corresponding to the intensity of a magnetic field applied thereto, and an element offset component (i.e., an element offset voltage). The offset cancel circuit 161 is a circuit that removes the element offset component from a signal detected by the magnetic field detection element EL and thus allows the detected signal to have only an effective signal component. A known circuit may be used as the offset cancel circuit, and its detailed description is not provided.

The amplification circuit 162 receives a signal processed by the offset cancel circuit 161 and amplifies the received signal with a predetermined gain.

The sample hold circuit 163 samples the signal from the amplification circuit 162 at predetermined intervals based on a predetermined clock, and holds the value of the sampled signal until a next sampling timing.

The filter circuit 164 is specifically configured as a low pass filter that filters the signal from the sample hold circuit 163.

The comparison circuit 165 compares the filtered signal outputted from the filter circuit 164 with a predetermined threshold value and outputs a signal OUT1 that indicates magnetism detected by the magnetic field detection element EL of the channel CH1.

The processing unit 170, similar to the processing unit 160, includes an offset cancel circuit 171, an amplification circuit 172, a sample hold circuit 173, a filter circuit 174, and a comparison circuit 175. The functions of the respective circuits included in the processing unit 170 are similar or the same as those of the circuits of the processing unit 160, and thus, a description is not provided. The processing unit 170 receives and processes a signal from a magnetic field detection element EL of a channel CH2 selected by the switching unit 130, and outputs a signal OUT2 that indicates magnetism detected by the magnetic field detection element EL of the channel CH2.

Moreover, in the above description, each of the magnetic field detection circuit 110 and processing circuit 150 of the magnetic field detection device 100 may be a circuit configured with separate electronic elements, or all or a portion of the magnetic field detection circuit 110 and processing circuit 150 may be integrated.

The following description will be made with reference to FIGS. 4 to 7 on the detailed arrangement of the magnetic field detection elements EL in the magnetic field detection unit 120, and a method that selects magnetic field detection elements, which are actually used for detection, from among the magnetic field detection elements EL.

Figure 4:
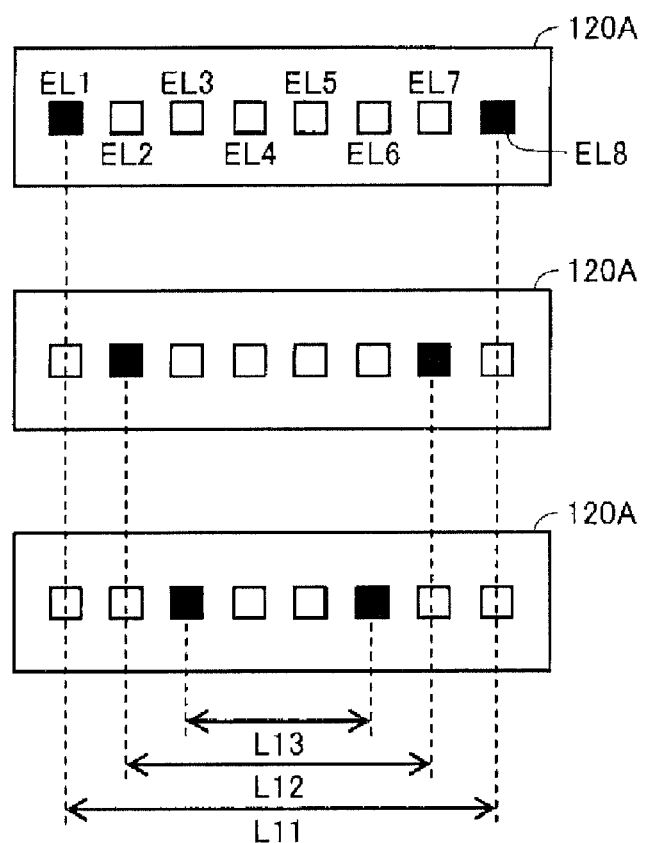
FIG. 4 is a diagram for describing a first example of the selection of magnetic field detection elements in a magnetic field detection unit.

FIG. 4 is a diagram for describing an example of the selection of magnetic field detection elements in a magnetic field detection unit. A magnetic field detection unit 120A of FIG. 4, for example, includes eight magnetic field detection elements EL1 to EL8, which are arranged in a straight line at an equal interval apart from each other in one row. However, the number of magnetic field detection elements EL included in the magnetic field detection unit 120A is not limited to eight, and the magnetic field detection unit 120A may include at least three magnetic field detection elements. Moreover, the magnetic field detection elements may not necessarily be arranged at an equal interval apart from each other.

In the magnetic field detection unit 120A of FIG. 4, two magnetic field detection elements EL are selected to have an approximately equal distance from a center (i.e., a central position between the magnetic field detection elements EL4 and EL5) of the arrangement of the eight magnetic field detection elements EL1 to EL8 in an arrangement direction thereof. Furthermore, a distance between the magnetic field detection elements becomes a distance suitable for a detection target object.

For example, when the magnetic field detection elements EL1 and EL8 are selected, a distance between the magnetic field detection elements EL1 and EL8 is L11. Further, the distance of the magnetic field detection element EL1 from the center is approximately same as the distance of the magnetic field detection element EL8 from the center. Alternatively, when the magnetic field detection elements EL2 and EL7 are selected, a distance between the magnetic field detection elements EL2 and EL7 is L12. Similarly, the distance of the magnetic field detection element EL2 from the center is approximately same as the distance of the magnetic field detection element EL7 from the center.

Such a selection method, for example, is suitable for a case where the magnetic field detection unit 120A is disposed such that a magnetic-pole boundary of a magnet to be detected is disposed near the center of the arrangement of the magnetic field detection elements EL1 to EL8.

Figure 5:
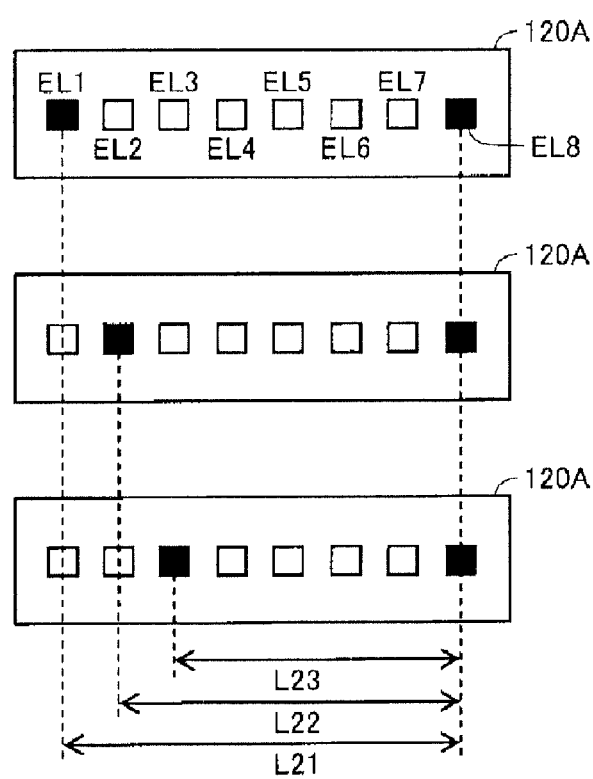
FIG. 5 is a diagram for describing a second example of the selection of magnetic field detection elements in a magnetic field detection unit.

FIG. 5 is a diagram for describing another embodiment of the selection of magnetic field detection elements in a magnetic field detection unit. A magnetic field detection unit 120A of FIG. 5, identically to FIG. 4, includes eight magnetic field detection elements EL1 to EL8 that are arranged in one row. In FIG. 5, however, predetermined one magnetic field detection element (for example, the magnetic field detection element EL8 in FIG. 5) is necessarily used, and another magnetic field detection element is selected from among the other magnetic field detection elements EL1 to EL7 such that a distance between the predetermined one magnetic field detection element and the selected magnetic field detection element becomes a desired distance.

Such a selection method, for example, is suitable for a case where the magnetic field detection unit 120A is disposed such that a specific detection element (for example, the magnetic field detection element EL8 in FIG. 5) is disposed at a predetermined position, e.g., a magnetic-pole reference of a magnet to be detected.

Figure 6:
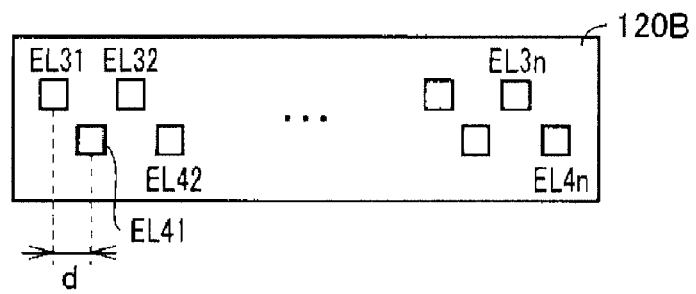
FIG. 6 is a diagram for describing an example of the arrangement of magnetic field detection elements in a magnetic field detection unit.

FIG. 6 is a diagram for describing another embodiment of the arrangement of magnetic field detection elements in a magnetic field detection unit. In a magnetic field detection unit 120B of FIG. 6, a plurality of magnetic field detection elements EL is arranged in two rows in a zigzag pattern. Such an arrangement enables a distance d between adjacent magnetic field detection elements (for example, a distance between magnetic field detection elements EL31 and EL41 of FIG. 6) to be set at a smaller distance than those in FIG. 4 or 5, in which the magnetic field detection elements are arranged in one row. This arrangement of the magnetic field detection elements at the smaller distance is suitable when the finer adjusting of a distance between the magnetic field detection elements is required.

Figure 7:
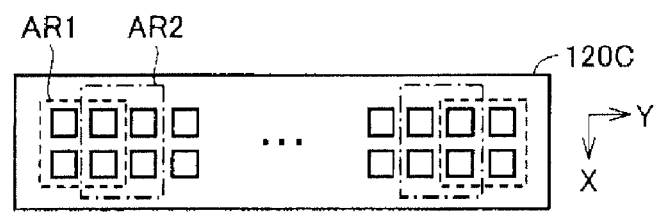
FIG. 7 is a diagram for describing an example of a magnetic field detection unit including the arrangement of magnetic field detection elements which are disposed in a plurality of rows.

FIG. 7 is a diagram for describing an example of a magnetic field detection unit including the arrangement of magnetic field detection elements which are disposed in a plurality of rows. Unlike in FIG. 6, a magnetic field detection unit 120C of FIG. 7 includes two rows of the magnetic field detection elements where each of the magnetic field detection elements of the first row is paired with one directly below, i.e., the opposing magnetic field detection elements in the second row. That is, the magnetic field detection elements are arranged and disposed in a direction of a short edge of the magnetic field detection unit 120C (an X-axis direction of FIG. 7).

In the arrangement of the magnetic field detection elements of FIG. 7, as described below with reference to FIG. 8, a detection block (for example, a detection block AR1 or AR2 of FIG. 7) is configured with a group of four adjacent magnetic field detection elements. The detection block AR1 or AR2 is regarded and used as one detection element.

Figure 8:
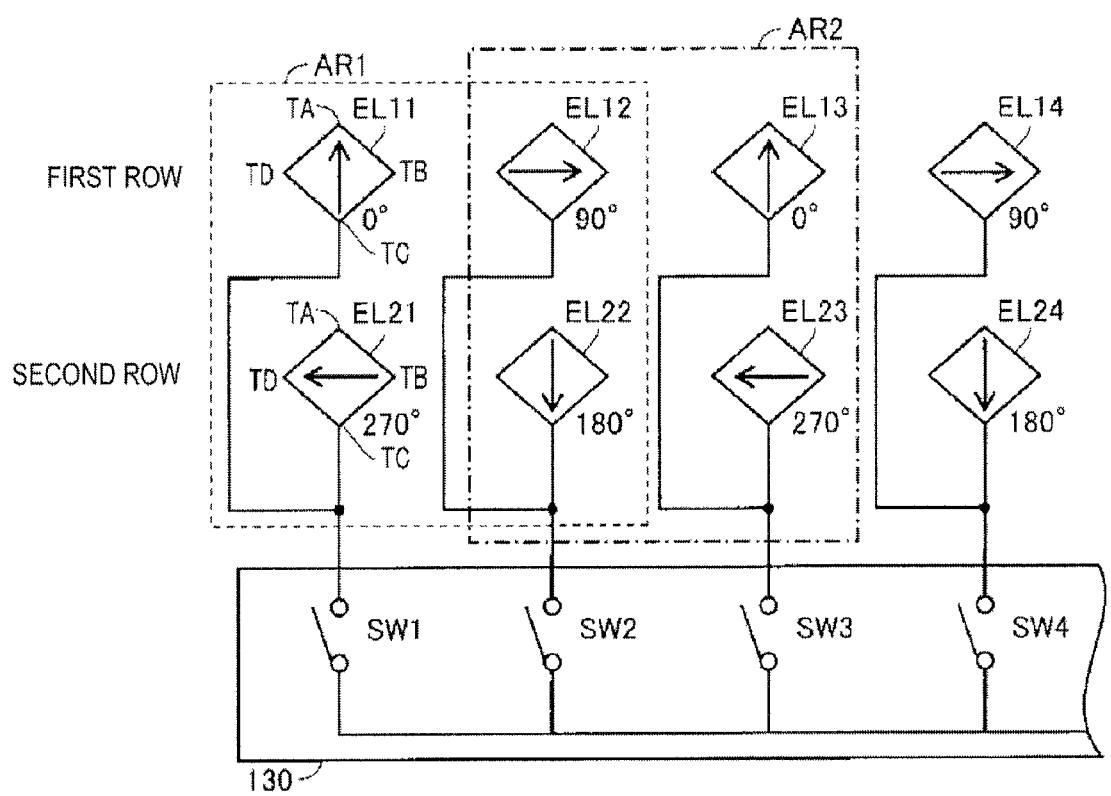
FIG. 8 is a diagram for describing a method of selecting magnetic field detection elements, in the magnetic field detection unit of FIG. 7.

FIG. 8 is a diagram for describing a method of selecting magnetic field detection elements, in the magnetic field detection unit 120C of FIG. 7. In FIG. 8, a description will now be described on a case where a hall element is used as a magnetic field detection element.

Referring to FIGS. 7 and 8, the magnetic field detection unit 120C includes a plurality of magnetic field detection elements EL11 to EL1n of the first row and a plurality of magnetic field detection elements EL21 to EL2n of the second row (where n is an integer equal to or more than five). In the first row and the second row, the opposing magnetic field detection elements, e.g., EL11 and EL21, are connected to a same switch included in the switching unit 130. For example, the magnetic field detection elements EL11 and EL21 are connected to a switch SW1 of the switching unit 130, and the magnetic field detection elements EL12 and EL22 are connected to a switch SW2 of the switching unit 130.

Herein, a hall element generally has two port pairs (for example, TA-TC and TB-TD in FIG. 8). Comparing a hall voltage, which is generated in a second port pair (for example, TB-TD) when a source voltage is applied to a first port pair (for example, TA-TC), with a hall voltage which is generated in the first port pair when the source voltage is applied to the second port pair, effective signal components corresponding to the intensity of a magnetic field applied to a corresponding hall element are in phase, but element offset components of the hall element are out of phase.

In an example of FIG. 8, a source voltage is applied to the magnetic field detection element EL11 of the first row in order for a current to flow in a direction from a port TC to a port TA. Furthermore, when the phase of the source voltage applied to the magnetic field detection element EL11 is 0 degree, the magnetic field detection element EL11 of the second row receives a source voltage having a phase that is shifted by 270 degrees from the phase of the source voltage applied to the magnetic field detection element EL11. That is, the source voltage is applied to the magnetic field detection element EL21 in order for a current to flow in a direction from a port TB to port TD of the magnetic field detection element EL21.

Moreover, in the first row, the magnetic field detection element EL12 adjacent to the magnetic field detection element EL11 receives a source voltage having a phase that is shifted by 90 degrees from the phase of the source voltage applied to the magnetic field detection element EL11, namely, a source voltage that allows a current to flow in a direction from the port TD to the port TB. Also, in the second row, the magnetic field detection element EL22 adjacent to the magnetic field detection element EL21 receives a source voltage having a phase that is shifted by 180 degrees from the phase of the source'voltage applied to the magnetic field detection element EL11, namely, a source voltage that allows a current to flow in a direction from the port TA to the port TC.

In this way, in the first row, source voltages are alternately applied to magnetic field detection elements such that the phase of the respective source voltages with respect to the source voltage applied to the magnetic field detection element EL11 becomes 90 degrees or 0 degree. In the second row, source voltages are alternately applied to magnetic field detection elements such that the phase of the respective source voltages with respect to the source voltage applied to the magnetic field detection element EL11 becomes 270 degrees or 180 degrees.

As described above, a magnetic field detection is performed by the detection block that is configured with four adjacent magnetic field detection elements. For example, when a magnetic field detection is performed by a detection block AR1 including the magnetic field detection elements EL11, EL12, EL21 and EL22, the switches SW1 and SW2 of the switching unit 130 are turned off. Also, when a magnetic field detection is performed by a detection block AR2 including the magnetic field detection elements EL12, EL13, EL22 and EL23, the switches SW2 and SW3 of the switching unit 130 are turned off. Furthermore, a switch of the switching unit 130 may be switched to select detection blocks for a detection target object such that a distance between the detection blocks becomes a desired distance.

In this way, four magnetic field detection elements included in one detection block receive voltages having a 90-degree phase difference, respectively. With such a configuration, in a signal of each channel that is outputted to the processing circuit 150 of FIG. 3, all or a portion of element offset components can be cancelled, and thus, the precision of a signal which indicates detected magnetism can be enhanced. Also, the processing units 160 and 170 may not include an offset cancel circuit, or may have a simpler configuration.

Moreover, in FIG. 8, an example that uses one detection block including four adjacent magnetic field detection elements is illustrated, but the present disclosure is not limited thereto. As another example, two magnetic field detection elements may configure one detection block, and specifically, the magnetic field detection elements EL11 and EL21 of FIG. 8 may configure one detection block, and the magnetic field detection elements EL12 and EL22 of FIG. 8 may configure one detection block.

Alternatively, magnetic field detection elements may be arranged in four rows from a first row to a fourth row, one detection block may be configured with four adjacent magnetic field detection elements located in a same horizontal position in each of the four rows (e.g., four first magnetic field detection elements in each row), and the phases of respective source voltages applied to the magnetic field detection elements included in the detection block may be shifted by 90 degrees from each other.

The following description will be described on an example of a method that selects magnetic field detection elements when a magnetic field detection device of the present embodiment is applied to a ring-shaped magnet.

Figure 9:
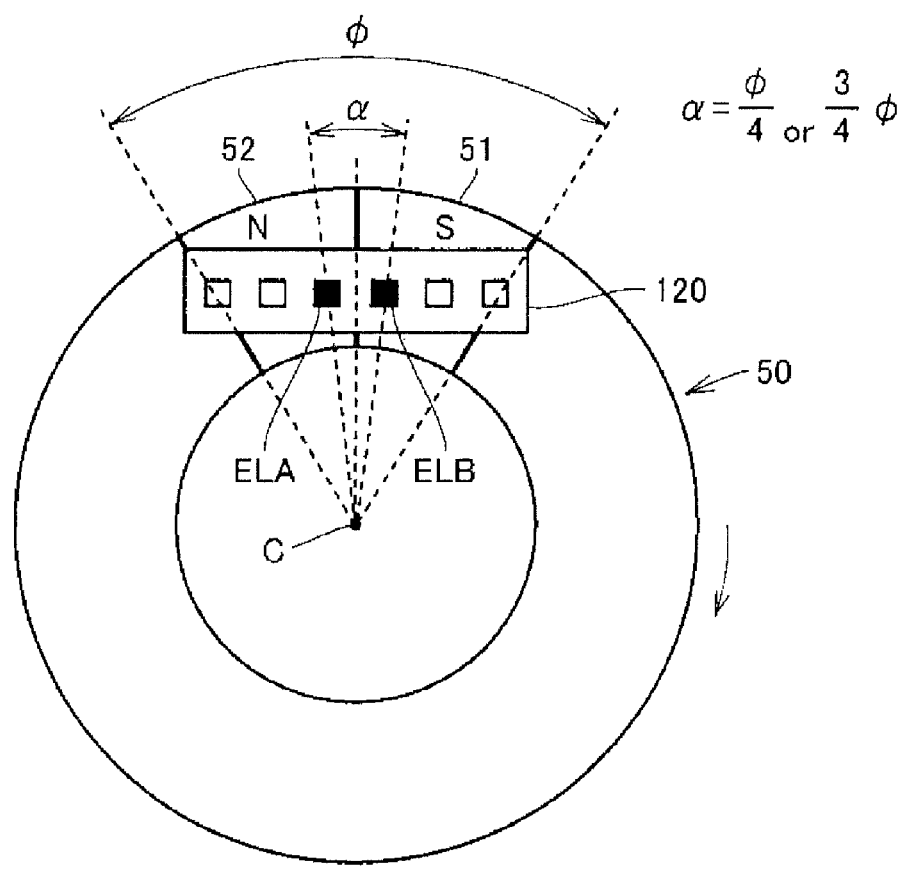
FIG. 9 is a diagram for describing a preferable method of selecting magnetic field detection elements, when detecting a ring-shaped magnet.

FIG. 9 is a diagram for describing a preferable method of selecting magnetic field detection elements, when detecting magnetism of a ring-shaped magnet 50 where N magnetic poles and S magnetic poles are alternately arranged in a circumference direction. Also, in FIG. 9, a case using a magnetic field detection unit 120D where a plurality of magnetic field detection elements are arranged in a straight-line in one row is described as an example as in the description of FIGS. 4 and 5, but the present embodiment is not limited thereto. As another example, the magnetic field detection unit 120D may have the arrangement of the magnetic field detection elements and the detection blocks that have been described above with reference to FIG. 6 or 7.

Referring to FIG. 9, S magnetic poles 51 and N magnetic poles 52 are alternately arranged in a circumference direction. An angle between a pair of adjacent magnetic poles 51 and 52 with respect to a center C of the ring-shaped magnet 50 is t. Furthermore, the magnetic field detection unit 120D where a plurality of magnetic field detection elements are arranged in one row is disposed as illustrated in FIG. 9.

In this case, among the magnetic field detection elements included in the magnetic field detection unit 120D, magnetic field detection elements ELA and ELB are selected to be used for detection, where an angle (a) between the magnetic field detection elements ELA and ELB with respect to the center C of the magnet 50 is Φ/4 or 3Φ/4 (i.e., α=Φ/4 or α=3Φ/4). The reason for the above-described selection will now be described with reference to FIG. 10.

Figure 10:
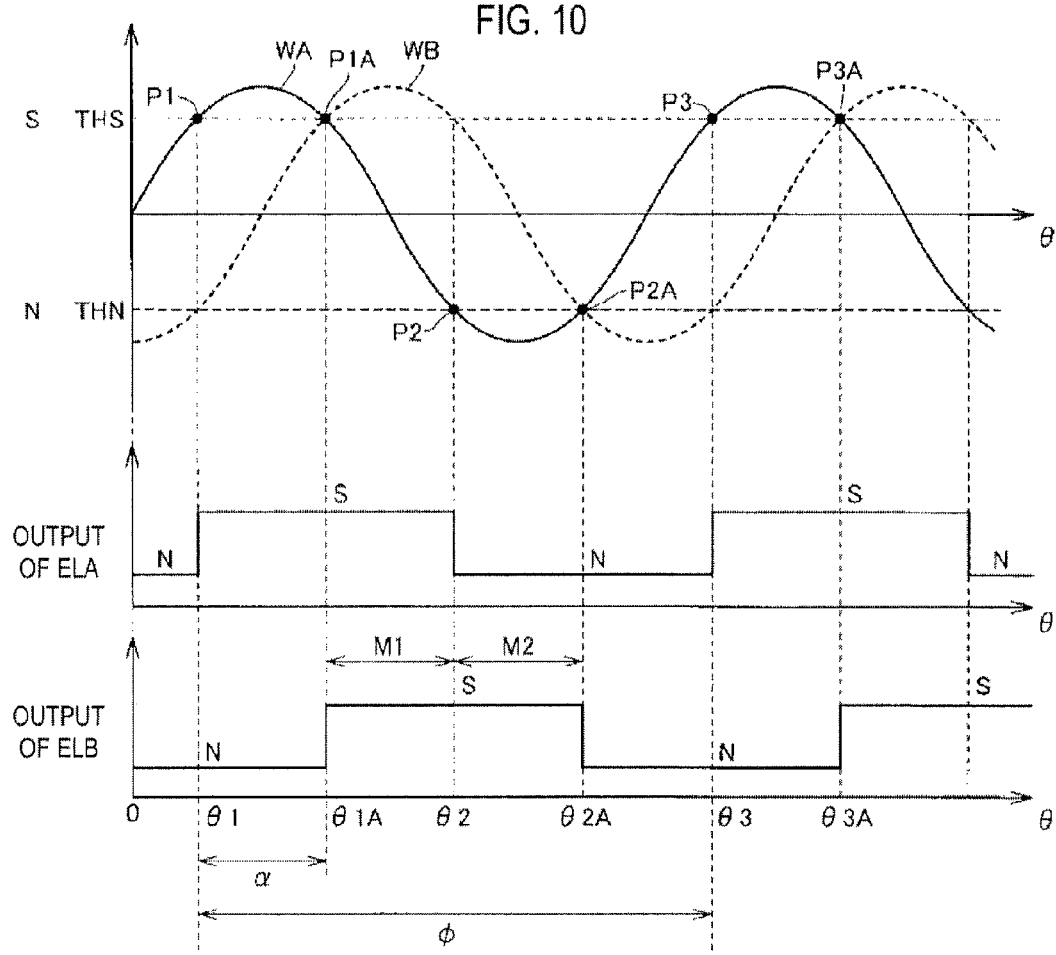
FIG. 10 is a diagram for describing an example of a detected signal in FIG. 9.

FIG. 10 is a diagram for describing a magnetic field that is detected by each magnetic field detection element in FIG. 9. In FIG. 10, the abscissa axis indicates a rotation angle (θ) of the magnet 50, an upper portion of the ordinate axis indicates the intensity of a magnetic field in each of the positions of the magnetic field detection elements ELA and ELB, a middle portion of the ordinate axis indicates an output signal OUTA that is generated by processing a magnetic signal detected by the magnetic field detection element ELA with the processing circuit 150 of FIG. 1, and a lower portion of the ordinate axis indicates an output signal OUTB that is generated by processing a magnetic signal detected by the magnetic field detection element ELB with the processing circuit 150 of FIG. 1. Also, in the upper portion of the ordinate axis, the intensity of a magnetic field regarding an S magnetic pole is represented to have a positive value, and the intensity of a magnetic field regarding an N magnetic pole is represented to have a negative value.

Referring to FIGS. 9 and 10, for example, when the magnet 50 rotates in a clockwise direction, the intensities of magnetic fields in the positions of the magnetic field detection elements ELA and ELB are respectively changed as shown in curves WA and WB, according to the rotation of the magnet 50.

In this case, for example, in the magnetic field detection element ELA, the output signal OUTA represents the S magnetic pole from point P1 where the intensity of the magnetic field reaches a threshold value THS of the S magnetic pole side to point P2 where the intensity of the magnetic field reaches a threshold value THIN of the N magnetic pole side (i.e., θ1<θ≤θ2). Then, the output signal OUTA represents the N magnetic pole until point P3 where the intensity of the magnetic field again reaches the threshold value THS of the S magnetic pole side (i.e., θ2<θ≤θ3).

Likewise, in the magnetic field detection element ELB, the output signal OUTB represents the S magnetic pole from point P1A to point P2A (i.e., θ1A<θ≤θ2A), and the output signal OUTB represents the N magnetic pole from point P2A to point P3A (i.e., θ2A<θ≤θ3A).

Herein, one cycle in the change of the intensity of the magnetic field (for example, θ1 to θ3) is an angle (Φ) between adjacent magnetic poles with respect to the center C of FIG. 9. Also, the angle (α) between the magnetic field detection elements ELA and ELB with respect to the center C is a size from θ1 to θ1A, namely, a phase difference between the output signals OUTA and OUTB.

Therefore, by making α=Φ/4 or α=3Φ/4, a switching timing of one of the output signals is disposed accurately near the center of adjacent switching timings in the other output signal. Accordingly, on a timing when switching is performed in one of the output signals, margins (for example, M1 and M2 in FIG. 10) of a switching timing in the other output signal that occur before and after the timing can be almost identical (M1=M2), and thus, the change of magnetic field switching can be appropriately detected.

In FIG. 9, the magnetic field detection device may be applied to various magnets having different sizes or angles (Φ) formed by adjacent magnetic poles, by selecting magnetic field detection elements in optimal positions from among the magnetic field detection elements of the magnetic field detection unit 120D in correspondence with the magnet.

As described above, in the present embodiment, disclosed is the magnetic field detection device that uses the magnetic field detection unit including three or more magnetic field detection elements. In the magnetic field detection device according to the present embodiment, a distance between magnetic field detection elements used for detection of a magnetic field can be set to vary according to a detection target object (for example, a magnet), and the single magnetic field detection unit can be used for different kinds of target objects having different sizes. Also, in a process of manufacturing a magnetic field detection unit, the positions of a plurality of magnetic field detection elements included in the magnetic field detection unit can be precisely determined and set, and thus, the precision of a distance between the magnetic field detection elements can be enhanced compared to a case where separate magnetic field detection elements are disposed in a circuit. Accordingly, a detection precision can be enhanced, and the number of components can be decreased, thus saving the manufacturing cost in manufacturing a circuit.

According to the present disclosure, the electronic circuit for magnetic field detection can maintain or enhance a magnetic field detection precision without accompanying the restriction of the shape of a magnet to be detected and the increase in the manufacturing cost.

While certain embodiments have been described, these embodiments have been presented by way of example only, and are not intended to limit the scope of the disclosures. Indeed, the novel, systems, methods, devices described herein may be embodied in a variety of other forms or may be combined; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An electronic circuit for detecting magnetism of a detection target object, comprising:
   a detection unit in which at least three detection blocks, each including four magnetic field detection elements arranged in two rows and two columns, are arranged in a straight line;
   a control unit configured to select first and second detection blocks from among the at least three detection blocks based on the detection target object;
   a switching unit configured to connect the selected first and second detection blocks to an output of the electronic circuit based on a control operation of the control unit; and
   first and second processing units respectively connected to the first and second detection blocks through the switching unit disposed therebetween, each of the first and second processing units configured to decrease an offset component included in a signal from the magnetic field detection element, which is included in each of the first and second detection blocks,
   wherein each of the detection elements corresponds to a hall element, and a source voltage is applied to each of the four magnetic field detection elements such that a phase difference between a current flowing in one magnetic field detection element and a current flowing in the other magnetic field detection element becomes 90 degrees, 180 degrees, or 270 degrees.

2. The electronic circuit of claim 1, wherein each of the first and second processing units comprises:
   an amplification circuit configured to amplify an output of a corresponding detection block;
   a sample hold circuit configured to receive and hold the amplified output; and a filter circuit configured to filter an output of the sample hold circuit.

3. The electronic circuit of claim 1, wherein, the detection target object is a circular magnet in which first and second magnetic poles having an opposite polarity from each other are alternately arranged to be adjacent to each other in a circumference direction, and the first and second detection blocks are selected such that a first angle formed by the first and second detection blocks with respect to a center of the circular magnet becomes one-fourth or three-fourth of a second angle formed by the first and second magnetic poles adjacent to each other with respect to the center of the circular magnet.

\* \* \* \* \*